United States Patent
Okamura

(10) Patent No.: US 8,627,168 B2
(45) Date of Patent: Jan. 7, 2014

(54) DECODING DEVICE AND DECODING METHOD

(75) Inventor: Toshihiko Okamura, Tokyo (JP)

(73) Assignee: NEC Corporation, Tokyo (JP)

( * ) Notice: Subject to any disclaimer, the term of this patent is extended or adjusted under 35 U.S.C. 154(b) by 231 days.

(21) Appl. No.: 13/254,747

(22) PCT Filed: Mar. 4, 2010

(86) PCT No.: PCT/JP2010/001501
§ 371 (c)(1),
(2), (4) Date: Sep. 2, 2011

(87) PCT Pub. No.: WO2010/103757
PCT Pub. Date: Sep. 16, 2010

(65) Prior Publication Data
US 2011/0320912 A1    Dec. 29, 2011

(30) Foreign Application Priority Data
Mar. 13, 2009   (JP) .................................. 2009-061184

(51) Int. Cl.
*H03M 13/00*    (2006.01)

(52) U.S. Cl.
USPC ........... 714/755; 714/786; 714/794; 714/762; 714/788; 714/780; 375/262; 375/341

(58) Field of Classification Search
USPC ................ 714/755, 786, 758, 762, 788, 780, 714/794–795; 375/262, 341
See application file for complete search history.

(56) References Cited

U.S. PATENT DOCUMENTS

2007/0220398 A1* 9/2007 Moon et al. .................... 714/758
2010/0017677 A1   1/2010 Okamura

FOREIGN PATENT DOCUMENTS

| JP | 2007-089064 A | 4/2007 |
| JP | 2007-208985 A | 8/2007 |
| WO | 2008/069231 A1 | 6/2008 |

OTHER PUBLICATIONS

Liang Chen, et al., "Implementation of Multi-Rate Quasi-Cyclic Low-Density Parity-Check Codes", Advanced Communication Technology, The 9th International Conference on Feb. 12-14, 2007, pp. 1066-1070, vol. 2.
David J. C. MacKay, "Good Error-Correcting Codes Based on Very Sparse Matrices", IEEE Transactions on Information Theory, Mar. 1999, pp. 399-431, vol. 45, No. 2.
Emmanuel Boutillon, et al., "Decoder-First Code Design", The 2nd International Symposium on Turbo Codes and Related Topics, 2000, pp. 1-4.
Dale E. Hocevar, "A Reduced Complexity Decoder Architecture Via Layered Decoding of LDPC Codes", IEEE SiPS 2004, 2004, pp. 107-112.

* cited by examiner

*Primary Examiner* — Guy Lamarre
(74) *Attorney, Agent, or Firm* — Sughrue Mion, PLLC

(57) ABSTRACT

A multistage difference cyclic permutation unit (106) for performing multistage cyclic permutation, an address administration unit (104) for administering addresses of the cumulative LLR memory (101), a received value arrangement unit (103) for generating records during writing of received values to the cumulative LLR memory (101), and a control unit (110) for generating parameters to control each unit from information of a parity check matrix and the current cyclic permutation size are prepared. The address administration unit (104) controls reading/writing addresses of the cumulative LLR memory (101) based on a reading start address from the cumulative LLR memory (101) corresponding to the column block. After the start of reading of a column block, the control unit (110) generates a reading start address in the next decoding of the column block and stores it into the address administration unit (104). In this manner, a device configuration capable of reducing a device size of a decoding device for pseudo-cyclic LDPC codes composed of cyclic permutation matrix blocks with a fixed degree of parallelism and an arbitrary cyclic permutation size is provided.

20 Claims, 10 Drawing Sheets

|  | COLUMN BLOCK 0 | COLUMN BLOCK 1 | COLUMN BLOCK 2 | COLUMN BLOCK 3 | COLUMN BLOCK 4 | |
|---|---|---|---|---|---|---|
| H = | I (0,0) | 0 | I (0,2) | I (0,3) | 0 | ROW BLOCK 0 |
| | 0 | I (0,1) | I (1,2) | I (1,3) | 0 | ROW BLOCK 1 |
| | 0 | I (1,1) | I (2,2) | 0 | I (0,4) | ROW BLOCK 2 |
| | I (0,1) | 0 | I (3,2) | 0 | I (1,4) | ROW BLOCK 3 |

$$\underbrace{\begin{matrix}10000010\\00001000\\00100000\\1\end{matrix}}\ \underbrace{\begin{matrix}01000001\\00000100\\00011000\\0\end{matrix}}\ \underbrace{\begin{matrix}00100000\\10000011\\00000100\\0\end{matrix}}\ \underbrace{\begin{matrix}00010000\\01100000\\10000010\\0\end{matrix}}\ \underbrace{\begin{matrix}00001\\10000010\\00001000\\0010\end{matrix}}$$

DECODING DEVICE AND DECODING METHOD

CROSS REFERENCE TO RELATED APPLICATIONS

This application is a National Stage of International Application No. PCT/JP2010/001501 filed Mar. 4, 2010, claiming priority based on Japanese Patent Application No. 2009-061184 filed Mar. 13, 2009 the contents of all of which are incorporated herein by reference in their entirety.

TECHNICAL FIELD

The present invention relates to a decoding device and a decoding method and, particularly, to a decoding device and a decoding method for a low-density parity-check code (LDPC) code, and, for example, to a decoding device and a decoding method capable of enhancing reliability of a communication system, a storage system and the like.

BACKGROUND ART

An error-correcting code is a technique to reduce the effects of noise occurring during data transmission in the process of coding and decoding. Coding is a process of adding redundancy to data to be transmitted, and the coded data is called a codeword. A codeword sent into a communication channel is affected by noise, resulting in an error such as having some bits inverted when the codeword is received. Decoding is a process of restoring the original data from the error-ridden received word by using redundancy.

The LDPC code is the error-correcting code proposed in 1960s; however, it had not drawn attention until late 1990s, when a relation with the Turbo code was pointed out (For example, see Non-Patent Literature 1).

The LDPC code is characterized by having a sparse parity check matrix with a small number of small loops when represented by the Tanner graph, and, because of such characteristics, there is a high-performance decoding method with relatively high efficiency. The decoding method is called Message-Passing decoding (hereinafter abbreviated as MP decoding).

The MP decoding of LDPC codes is performed by iteratively updating reliability information of codeword bits by column processing corresponding to columns of the parity check matrix and row processing corresponding to rows of the same. The reliability information generated by the row processing is called external information. The sequence of the iterative update is arbitrary. Serial scheduling in which the external information which has been updated in the row processing is used in the subsequent row processing in the same iteration is also called layered scheduling, which is disclosed in Non-Patent Literatures 2 and 3, for example.

The received value and the reliability information are generally stored in the form of log-likelihood ratio (LLR). In typical implementation of the serial scheduling, a plurality of memories that store cumulative LLR that is received values or the sum of received values and external information, and a plurality of memories that store external information are included. The former is referred to as cumulative LLR memories, the latter is referred to as external information memories, and they are collectively referred to as LLR memories.

Although the speedup of a decoding process is achieved by parallel processing that concurrently performs row processing on a plurality of rows, an access method to the LLR memories and routing of data between the LLR memories and processors are raised as issues. A pseudo-cyclic LDPC code is known as the code class capable of addressing such issues with high efficiency.

FIG. 8 shows an example of a parity check matrix of the pseudo-cyclic LDPC code. As shown in FIG. 8, the parity check matrix is made up of square submatrices of the same size, and the submatrices correspond to matrices I(j,k) representing a cyclic permutation formed by shifting a zero matrix or a unit matrix. Note that FIG. 8 shows an example of a parity check matrix with a cyclic permutation size Z=5. Row and column components in units of the submatrices are respectively referred to as a row block and a column block. In the example of FIG. 8 with a cyclic permutation size Z=5, the parity check matrix is made up of row blocks 0, 1, 2 and 3 and column blocks 0, 1, 2, 3 and 4. Further, in the parity check matrix, one number in columns and rows are respectively called the column order and the row order.

In the pseudo-cyclic LDPC code, the columns or the rows in the same column block or the same row block have the same order. The submatrices which are not a zero matrix in a column block k (order d_k) are represented as I(0,k), I(1,k), ..., I(d_k−1,k) sequentially from the top. I(j,k) can be represented using a shift value for each row of a unit matrix, and it is represented as s(j,k). For example, s(j,k)=0,1 represents that I(j,k) is a unit matrix, and each row of the unit matrix is shifted by one cycle to the right.

In the pseudo-cyclic LDPC code, processing can be performed efficiently by carrying out parallel processing in units of Z number of rows for the cyclic permutation size Z. The cumulative LLR and the external information are read and written in units of Z number of data in one column block as one record. FIG. 9 is a schematic diagram showing a cumulative LLR memory structure and a data storing method for the parity check matrix of FIG. 8.

In FIG. 9, "0 1 2 3 4" in one record means storing data corresponding to positions from 0 to 4 (in the case of Z=5) in each column block. In the parity check matrix of FIG. 8, the column blocks 0 and 1 and the column blocks 3 and 4 do not make simultaneous access to the cumulative LLR memory, and therefore they can be stored in the same cumulative LLR memory. Thus, in such a case, a decoding device can be configured using three independent cumulative LLR memories, i.e., a cumulative LLR memory 0 storing the column blocks 0 and 1, a cumulative LLR memory 1 storing the column block 2, and a cumulative LLR memory 2 storing the column blocks 3 and 4.

During reading from the cumulative LLR memory, data which has been read in units of records is cyclically permutated according to I(j,k) by barrel shift and transmitted to components for performing the column processing and the row processing. The cumulative LLR updated herein undergoes the cyclic permutation corresponding to the inverse permutation of I(j,k) and written to the cumulative LLR memory.

In an application of mobile communication and the like, a frame structure that enables flexible handling of a channel state, a transmission data size and the like is required, and an error-correcting code needs to have a variable code length. The pseudo-cyclic LDPC code can satisfy the need by making the cyclic permutation size Z variable.

However, when the cyclic permutation size Z is made variable, the overhead of a cyclic permutation means which accompanies parallel processing tends to increase according to the fineness of setting. The most straightforward way is to prepare cyclic permutation means corresponding to all possible cyclic permutation sizes Z and switch them depending on the value of the actual cyclic permutation size Z. However, this is extremely wasteful when there are many different cyclic permutation sizes Z.

When the cyclic permutation size Z is a multiple of a certain integer, it can be represented by the pseudo-cyclic LDPC code based on cyclic permutation with the size of the integer by replacing rows and columns. However, in this method also, when detailed setting of the cyclic permutation size Z is possible, it is represented as the pseudo-cyclic LDPC code with a small cyclic permutation size, and the degree of parallelism is not so large, failing to achieve speedup.

Implementation of a decoding device which is compatible with any shift size Z or cyclic permutation size Z in a process of a fixed degree of parallelism S (the number of data in a LLR record) is a desirable form of implementation of a decoding device intended for an application with a variable code length. In this case, in column processing/row processing components, it is enough to prepare S number of processors for the column processing 1 and the column processing 2, and is possible to operate them efficiently if S number of data is input each time. Under the condition that the cyclic permutation size Z is 2 S or more, an implementation example of this method is described in Patent Literature 1, i.e., WO2008/069231.

According to the technique of Patent Literature 1, a LLR memory for storing reliability information stores data in a cyclically magnified manner so that it is a multiple of the degree of parallelism S. FIG. 10 is a schematic diagram of a data storing method of a cumulative LLR memory in Patent Literature 1. As shown in FIG. 10, the final record is made up of data corresponding to indexes 12, 13, 14, 0, 1, 2 in the column block. The depth D of the LLR memory per column block is 3.

In practice, data is stored in units of column blocks in an alignment corresponding to the maximum value MaxZ of the cyclic permutation size Z. The row processing is also executed in a cyclically magnified manner. The cyclic permutation is implemented by a multistage cyclic permutation means that executes, for input in units of records with the size S or the degree of parallelism S, output with the size S conforming to I(j,k) by a shift and a selection switch from two adjacent records in multiple stages. During writing to the memory, the multistage cyclic permutation means with the size S, which is inverse permutation of I(j,k), is executed.

FIG. 11 is a block diagram showing a configuration of a decoding device according to related art, and it shows a configuration of a decoding device for serial scheduling in Patent Literature 1. In FIG. 11, a ROM 100 is a memory that stores the structure of the parity check matrix and information of I(j,k) in FIG. 8. Further, a cumulative LLR memory 101 is a memory that stores cumulative LLR that is received values or the sum of received values and external information in units of records each containing S number of data (in units of single reading/writing). Although FIG. 11 shows an image with two cumulative LLR memories 101, it is enough to prepare three cumulative LLR memories 101 as shown in FIG. 9 if a code has the parity check matrix of FIG. 8.

A memory input control 102 sorts the received values input to the decoding device out to the cumulative LLR memories according to the structure of the column block of the parity check matrix. A record generation means 103a performs processing of generating records each containing S number of data from the received values, which are the input data to the decoding device.

Multistage cyclic permutation means 106a and 106b execute cyclic permutation processing corresponding to I(j,k) and the inverse permutation of I(j,k), i.e., $I(j,k)^{-1}$ ($-s(j,k)$ mod Z in a shift value), respectively, for the cumulative LLR by input/output in units of records with the size S.

A column processing/row processing component 105 is a device for actually performing the MP decoding, and S number of column processing/row processing components 105 operate independently of one another. Although an external information memory is in the form of a constituent element of the column processing/row processing components 105 in FIG. 11, a configuration in which a column processing means is placed between the cumulative LLR memory 101 and the cyclic permutation processing may be adopted.

A hard decision means 107 makes decision of 0 or 1 on a decoding result from the cumulative LLR. Further, a decoding result memory 108 is a memory that stores a hard decision result of the hard decision means 107. An output sequence forming means 109a performs processing of forming an output bit sequence by eliminating a cyclically padded portion in the decoding result. A control means 110a adjusts parameters in accordance with the cyclic permutation size Z at the start of decoding, and, when processing a column block corresponding to I(j,k), generates addresses of the column processing/row processing components 105 and the cumulative LLR memory 101 according thereto.

CITATION LIST

Patent Literature

Patent Literature 1: WO2008/069231, "DECODING DEVICE AND DECODING METHOD" (pp. 8-10)

Non Patent Literature

Non-Patent Literature 1: D. J. C. Mackay: "Good Error Correcting Codes based on Very Sparse Matrices", IEEE Transactions on Information Theory 45 pp. 399-431, 1999.

Non-Patent Literature 2: E. Boutillon, J. Castura, and F. R. Kschischang: "Decoder-First Code Design", the 2nd International Symposium on Turbo Codes and Related Topics," pp. 459-462, 2000.

Non-Patent Literature 3: D. E. Hocevar: "A Reduced Complexity Decoder Architecture via Layered Decoding of LDPC Codes", IEEE SiPS 2004, pp. 107-112, 2004.

SUMMARY OF INVENTION

Technical Problem

The technique of Patent Literature 1 is compatible with any cyclic permutation size Z of 2 S or above with a fixed degree of parallelism S, in the decoding of the pseudo-cyclic LDPC code with a variable code length based on the variability of the cyclic permutation size Z, and effectively achieves parallel processing for an application where detailed setting is made for the cyclic permutation size Z. However, in comparison with a simple case of Z=S as shown in FIG. 9 with the same degree of parallelism, the size of the device necessary for cyclic permutation is two to three times larger, and there is a significant impact on the complexity of the decoding device as a whole. Therefore, in the decoding of the pseudo-cyclic LDPC code, a technique of improving such an overhead in the cyclic permutation processing caused by the variable cyclic permutation size Z is desirable.

Object of Invention

The present invention has been accomplished in view of the above problems, and an object of the present invention is thus to provide a decoding device and a decoding method compatible with any cyclic permutation size Z with a fixed degree of parallelism S with a reduced device size.

Solution to Problem

To solve the above problems, the decoding device and the decoding method according to the present invention employ the following characteristic structures. The numbers (1) and (8) respectively correspond to Claim numbers.

(1) A decoding device for pseudo-cyclic low-density parity-check codes having a structure with a variable cyclic permutation size, at least including:

a plurality of cumulative LLR memories for storing cumulative reliability information being received values of the low-density parity-check codes or a sum of reliability information generated in a decoding process and the received values;

a plurality of column processing/row processing components each including a plurality of processors corresponding to column processing and row processing of low-density parity-check code decoding for updating the reliability information;

a multistage difference cyclic permutation means for performing cyclic permutation of data in a multistage fashion with a degree of parallelism corresponding to the number of data in one record of the cumulative LLR memories between the cumulative LLR memories and the column processing/row processing components, and, during writing to the cumulative LLR memories, executing processing integrating permutation for subsequent reading;

a received value arrangement means for performing permutation of received data during writing of the received data to the cumulative LLR memories in accordance with operation of the multistage difference cyclic permutation means;

an address administration means for storing a reading start address of the cumulative LLR memories and incrementing the address at reading in accordance with operation of the multistage difference cyclic permutation means; and a control means for calculating parameters to be used by the multistage difference cyclic permutation means and the received value arrangement means and the reading start address of the cumulative LLR memories to be stored in the address administration means.

(8) A decoding method for pseudo-cyclic low-density parity-check codes having a structure with a variable cyclic permutation size, at least including:

a storing step for storing cumulative reliability information being received values of the low-density parity-check codes or a sum of reliability information generated in a decoding process and the received values into a memory; and a multistage difference cyclic permutation step for performing cyclic permutation of data in a multistage fashion with a degree of parallelism corresponding to the number of data in one record of the memory during column processing and row processing of low-density parity-check code decoding for updating the reliability information, and, during writing to the memory, executing processing integrating permutation for subsequent reading, wherein, during writing of the received data to the memory, permutation of received data is performed, and, during reading from a reading start address of the memory, the reading start address is incremented and stored again, in accordance with operation of the multistage difference cyclic permutation step.

Advantageous Effects of Invention

According to the decoding device and the decoding method of the present invention, the following advantageous effects can be obtained.

The invention shows a device configuration compatible with any cyclic permutation size with a fixed degree of parallelism in a decoding device for pseudo-cyclic LDPC codes which is made up of cyclic permutation matrix blocks. The decoding device can be achieved using a technique of performing multistage cyclic permutation in units of a fixed degree of parallelism, and in the present invention, during writing of received values and reliability information to the cumulative LLR memory, difference permutation integrating cyclic permutation to be applied during the subsequent reading is applied, thereby eliminating the need for multistage cyclic permutation during the reading, thereby achieving improvement of a device size.

Specifically, according to the present invention, a multistage cyclic permutation means during reading from the cumulative LLR memory can be eliminated. On the other hand, a multistage cyclic permutation means during writing can be implemented in the same configuration as described in Patent Literature 1 in the basic sense. Note that, to implement the present invention, it is necessary to add a function of administering addresses of the cumulative LLR memories and a function of arranging input received values; however, those functions to be added can be implemented with a significantly smaller size than the multistage cyclic permutation means. Thus, the present invention enables improvement of the device size of the decoding device, maintaining a high flexibility for the setting of the cyclic permutation size and a high degree of parallelism.

BRIEF DESCRIPTION OF DRAWINGS

FIG. 8 is a determinant showing an example of a parity check matrix of a pseudo-cyclic LDPC code;

DESCRIPTION OF EMBODIMENTS

Preferred examples of a decoding device and a decoding method according to the present invention are described hereinafter with reference to the accompanying drawings.

Figure 1:
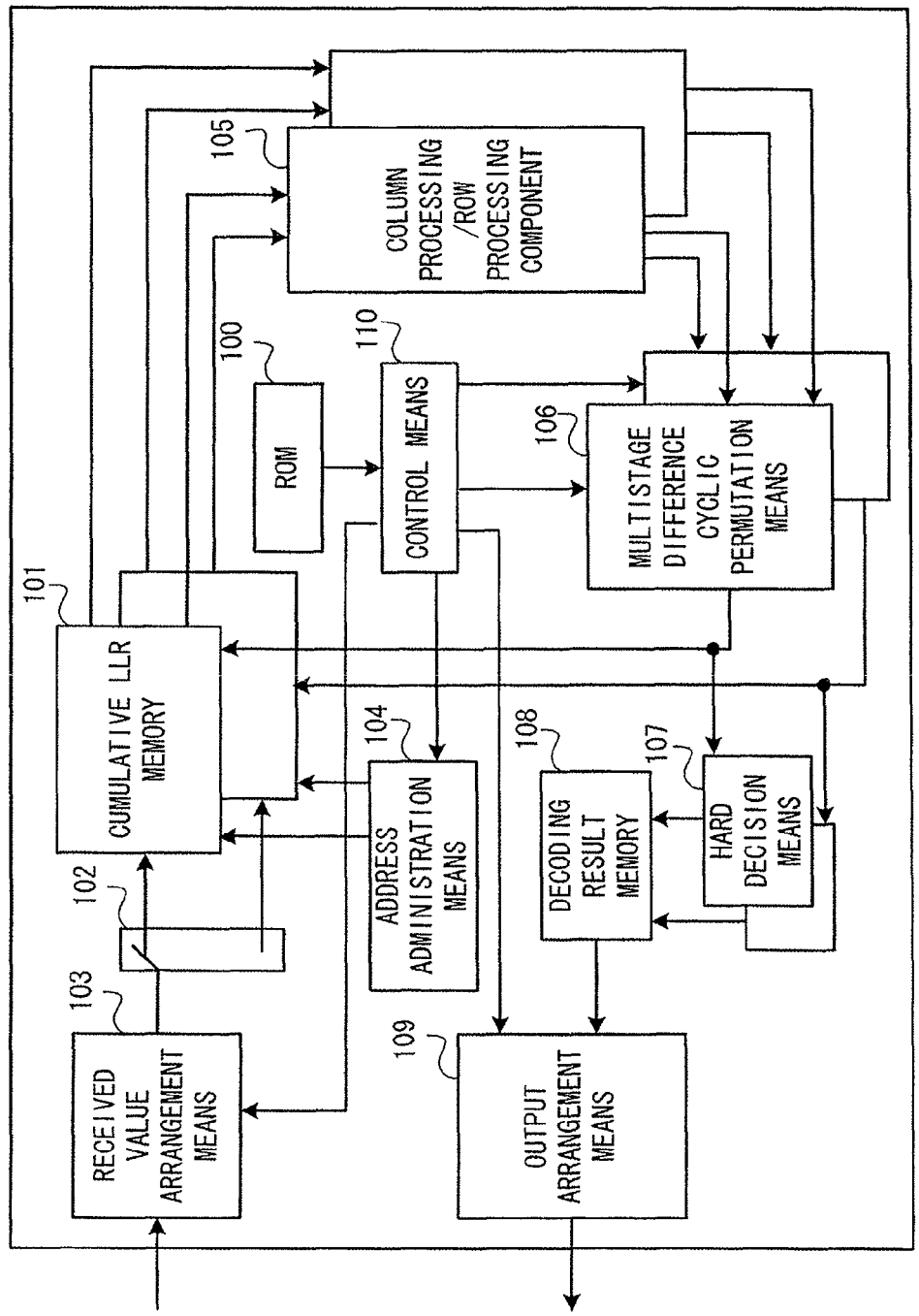
FIG. 1 is a block diagram showing a configuration example of a decoding device according to the present invention.

FIG. 1 is a block diagram showing a configuration example of a decoding device according to the present invention. Hereinafter, a cyclic permutation size of a pseudo-cyclic LDPC code is Z, and the degree of parallelism in decoding is S. The degree of parallelism S is fixed, and the cyclic permutation size Z, which is 2 S or greater, is externally set to any value prior to the start of decoding.

Figure 11:
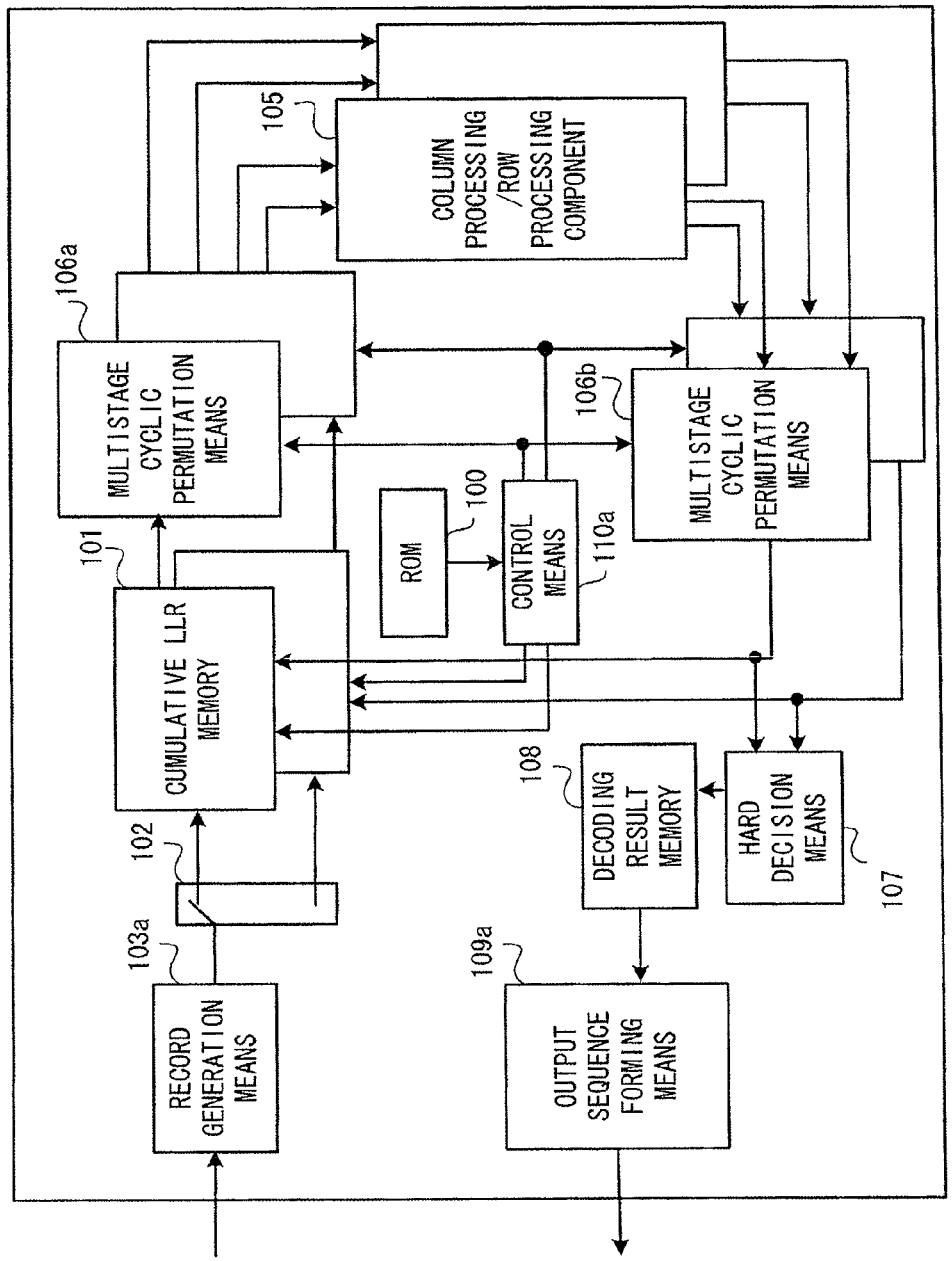
FIG. 11 is a block diagram showing a configuration of a decoding device according to related art.

Among the constituent elements of the decoding device in FIG. 1, the circuit elements having the same functions as those of the decoding device in FIG. 11 according to related art are denoted by the same reference symbols as in FIG. 11, and redundant explanation thereof is omitted.

A received value arrangement means 103 arranges the received values LLR by record containing S number of data in the sequence based on a submatrix I(0,k) of a non-zero matrix for each column block of a parity check matrix, and the values are written to a cumulative LLR memory 101. Further, an address administration means 104 stores and updates addresses for making access to the cumulative LLR memory 101 in accordance with a multistage difference cyclic permutation means 106.

The multistage difference cyclic permutation means 106 performs processing that executes multistage difference cyclic permutation corresponding to $I(j+1,k) \cdot I(j,k)^{-1}$ (that is, cyclic shift of $(s(j+1,k)-s(j,k))$ mod $Z$) with the degree of parallelism S on the cumulative LLR data that is output from the column processing/row processing component 105. An output arrangement means 109 performs cyclic permutation which corresponds to inverse permutation of I(0,k) and thereby arranges the output bit sequence when outputting a decoding result. A control means 110 makes parameter adjustment in accordance with the cyclic permutation size Z at the start of decoding, and performs calculation and setting of parameters, memory addresses and the like which are necessary for the operation of the received value arrangement means 103, the address administration means 104, the multistage difference cyclic permutation means 106 and the output arrangement means 109 for each column block.

Note that the column processing/row processing component 105 has a configuration in which S number of components corresponding to S number of rows operate independently of one another in the same manner as in FIG. 11.

Each of the above-described elements is described hereinafter in detail.

The control means 110, at the start of decoding, calculates a memory depth D for each column block and the number of data E of a final record respectively corresponding to the cyclic permutation size Z using the following Expressions 1 and 2 and sets them to the received value arrangement means 103, the address administration means 104 and the multistage difference cyclic permutation means 106.

$D \leftarrow roundup(Z/S)$. [Expression 1]

$E \leftarrow Z \bmod S$. [Expression 2]

"roundup( )" indicates a function representing rounding up to the whole number, and "x Mod y" is a remainder of x for y, which takes on values from 1 to y.

Further, for each component, the following parameters are generated.

(a) Parameters to be set to the received value arrangement means 103: At the start of decoding, Offset, Gap, and Flag of the following Expression 3 to 5 are generated for a shift value s(0,k) of I(0,k) for each column block.

Offset$\leftarrow s(j,k)$ mod $S$. [Expression 3]

Gap$\leftarrow$truncate$(s(j,k)/S)$. [Expression 4]

Flag$\leftarrow$(Offset$<E$?0:1). [Expression 5]

"mod S" means taking on values from 0 to S−1. "truncate( )" is a function representing rounding down to the whole number. "(x<y?:0:1)" indicates a function returning 0 when x<y and 1 when not.

(b) Parameters to be set to the multistage difference cyclic permutation means 106: At the update of a message corresponding to I(j,k), the following Expressions 6 to 8 are calculated from shift values s(j,k) and s(j+1,k) respectively corresponding to I(j,k) and I(j+1,k). Note that, when the order of the column block k is d_k in Expressions 6 and 7, I(d_k,k)=I(0,k) and s(d_k,k)=s(0,k) in a cyclic fashion.

Offset'$\leftarrow((s(j+1,k)-s(j,k))$ mod $Z$) mod $S$. [Expression 6]

Gap'$\leftarrow$truncate$(((s(j+1,k)-s(j,k))$ mod $Z)/S)$. [Expression 7]

Flag'$\leftarrow$(Offset'$<E$?0:1). [Expression 8]

(c) Parameters to be set to the address administration means 104: At the start of decoding, the initial read address init_address of the cumulative LLR memory 101 of the following Expression 9 is calculated for the column block k using Expressions 4 and 5, and set as an initial value of read_address.

init_address$\leftarrow$(Gap+Flag). [Expression 9]

On the other hand, during loop processing, at the update of a message corresponding to I(j,k), next_address is calculated based on the following Expression 10 for read_address, which is the current read address of the cumulative LLR memory 101 corresponding to the column block k which is acquired from the address administration means 104, by using Expressions 7 and 8, and set as read_address subsequent to the current column block in the address administration means 104.

next_address$\leftarrow$(Gap'+Flag'+read_address) mod $D$. [Expression 10]

Next, an internal configurations of each of the elements described above is described in detail with reference to the drawings.

Figure 2:
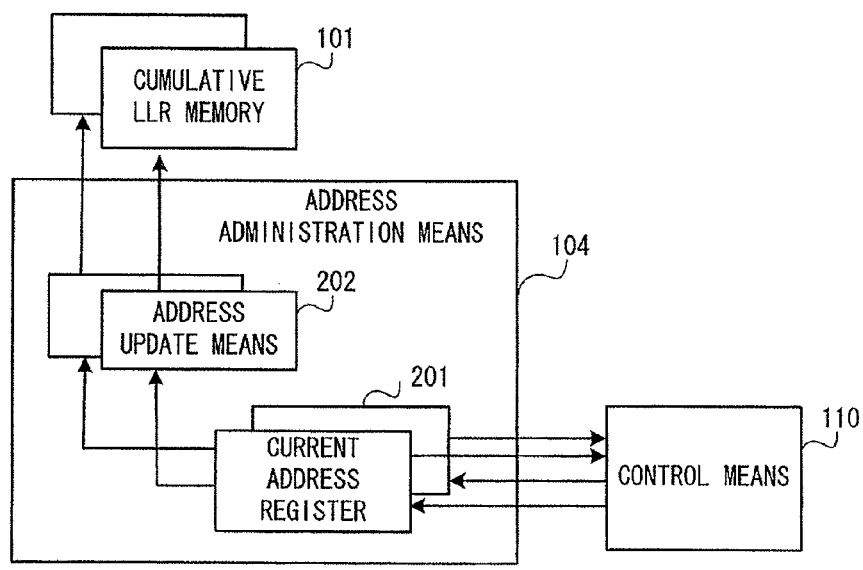
FIG. 2 is a block diagram showing an example of an internal configuration of an address administration means of the decoding device shown in FIG. 1.

FIG. 2 is a block diagram showing an example of an internal configuration of the address administration means 104 of the decoding device shown in FIG. 1. The address administration means 104 at least includes a current address register 201 and an address update means 202.

The current address register 201 stores read_address, which is a read start address of the cumulative LLR memory 101, for each column block. In typical implementation, the current address registers 201 are prepared to respectively correspond to the cumulative LLR memories 101, and each current address register 201 stores read_address of a plurality of column blocks corresponding to the cumulative LLR memories 101. At the start of decoding corresponding to I(j,k), read_address is set to the address update means 202.

The control means 110 receives read_address set to the address update means 202 and calculates next_address after update. The address administration means 104 stores it as read_address of the cumulative LLR memory 101 for the column block k during decoding corresponding to I(j+1,k).

The address update means 202 are prepared to respectively correspond to the cumulative LLR memories 101. The address update means 202 holds a counter and increments the counter by mod D. The initial value of the counter is set to read_address stored in the current address register 201. The actual physical address of the cumulative LLR memory 101 is the sum of the value calculated in the address update means 202 and the offset value corresponding to the area of the memory of the column block.

Writing to the cumulative LLR memory 101 is performed on the address where reading has been performed in the same sequence. The address during writing is achieved by setting the initial value of the counter which is the same as the address during reading. Alternatively, the address during reading may be stored temporarily using a register or the like and obtained.

Figure 3:
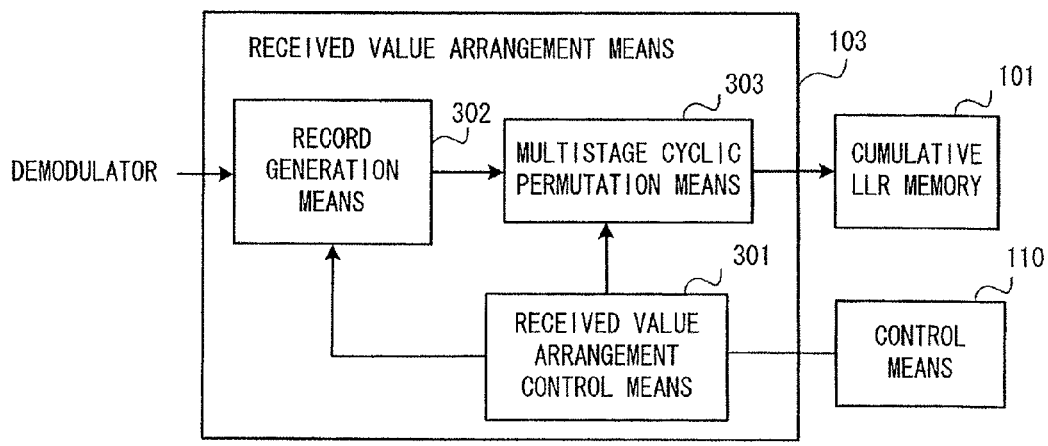
FIG. 3 is a block diagram showing an example of an internal configuration of a received value arrangement means of the decoding device shown in FIG. 1.

Next, FIG. 3 is a block diagram showing an example of an internal configuration of the received value arrangement means 103 of the decoding device shown in FIG. 1. The received value arrangement means 103 at least includes a received value arrangement control means 301, a record generation means 302, and a multistage cyclic permutation means 303.

The received value arrangement control means 301 controls the record generation means 302 and the multistage cyclic permutation means 303 based on the parameters set by the control means 110. The record generation means 302 generates records each containing S number of data by cyclically complementing the head data when the number of data E of the final record and the degree of parallelism S do not match, and transmits the records to the multistage cyclic permutation means 303. The multistage cyclic permutation means 303 performs multistage cyclic permutation corresponding to the column block I(0,k) based on Offset, Gap and Flag of Expressions 3 to 5 described earlier. Note that the multistage cyclic permutation means 303 can be achieved in the same configuration as the multistage difference cyclic permutation means 106 in FIG. 1.

In the decoding process of the pseudo-cyclic LDPC code according to the present invention, it is necessary to implement the cyclic permutation which corresponds to the inverse permutation of I(0,k) when outputting a decoding result of the column block k. In the decoding device of FIG. 1, a means to implement this processing is represented as the output arrangement means 109.

The hard decision corresponding to the column block k is performed at the point of time when update of the reliability information corresponding to I(d_k−1,k) ends. At this time, the control means 110 sets the following parameters to the output arrangement means 109. Specifically, at the start of decoding, Offset", Gap", Flag", and output_address of the following Expressions 11 to 14 are generated for the shift value $(-s(0,k) \mod Z)$ of $I(0,k)^{\{-1\}}$ on each column block.

$$\text{Offset"} \leftarrow (-s(0,k) \mod Z) \mod S. \quad \text{[Expression 11]}$$

$$\text{Gap"} \leftarrow \text{truncate}(((s(0,k)) \mod Z)/S). \quad \text{[Expression 12]}$$

$$\text{Flag"} \leftarrow (\text{Offset"} < E?0:1). \quad \text{[Expression 13]}$$

$$\text{output\_address} \leftarrow (\text{Gap"} + \text{Flag"}). \quad \text{[Expression 14]}$$

Figure 4:
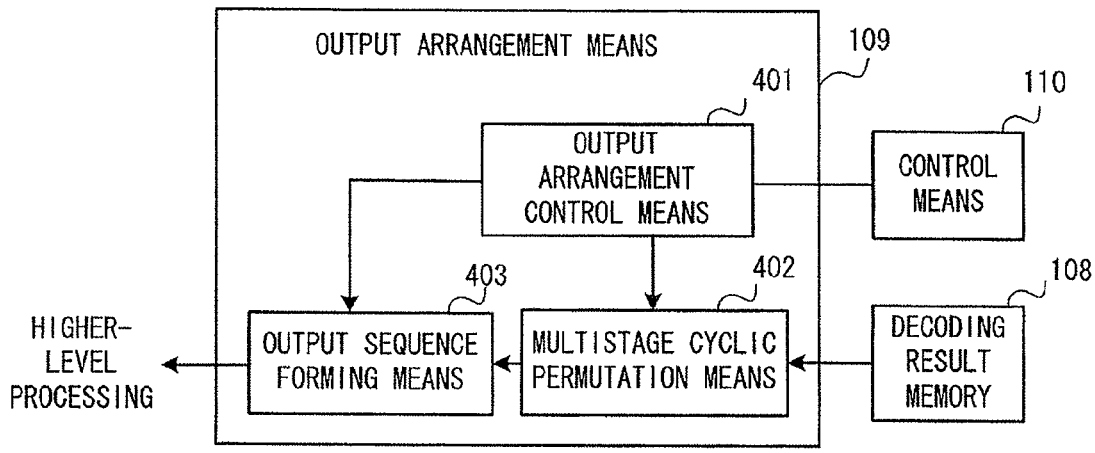
FIG. 4 is a block diagram showing an example of an internal configuration of an output arrangement means of the decoding device shown in FIG. 1.

FIG. 4 is a block diagram showing an example of an internal configuration of the output arrangement means 109 of the decoding device shown in FIG. 1. The output arrangement means 109 at least includes an output arrangement control means 401, a multistage cyclic permutation means 402, and an output sequence forming means 403.

The output arrangement control means 401 controls the multistage cyclic permutation means 402 and the output sequence forming means 403 based on the parameters set by the control means 110. The multistage cyclic permutation means 402 performs multistage cyclic permutation corresponding to the column block $I(0, k)^{\{-1\}}$ based on Offset", Gap", and Flag" of Expressions 11 to 13. The multistage cyclic permutation means 402 can be achieved in the same configuration as the multistage difference cyclic permutation means 106 in FIG. 1 (except that the data is one bit).

The output sequence forming means 403 temporarily stores the output of the multistage cyclic permutation means 402, performs cyclic reading by mod D from output_address of Expression 14 as the starting point, and finally generates an output sequence by deleting (S-E) number of cyclically padded bits. In the case where the cyclic permutation I(0,k) at the head of each column block of the parity check matrix is a unit matrix, the multistage cyclic permutation means 303 and 402 in FIGS. 3 and 4, respectively, become unnecessary, thereby enabling simplification.

Operation Example

First, an example of MP decoding algorithm of an LDPC code is described. The positions at which '1' exists in a given row with the order e are $p_{\_0}, \ldots, p_{\_}(e-1)$. Further, the column order of p_k is d_k, and indexes 0, 1, . . . , (d_k 1) are sequentially assigned to the corresponding row. The external information which is generated in the row processing for the row corresponding to an index j at p_k is λ(p_k,j). It is assumed that the received values and the external information are represented in the form of LLR (Log-Likelihood Ratio). The cumulative LLR corresponding to p_k can be represented as the following Expression 15.

$$V(p\_k) \leftarrow r(p\_k) + \lambda(p\_k,0) + \lambda(p\_k,1) + \ldots + \lambda(p\_k, d\_k-1) \quad \text{[Expression 15]}$$

r(p_k) is the received value corresponding to p_k, and λ(p_k,j) is normally initialized to 0 or undergoes the equal processing, and the decoding process is started. It is assumed that the row of interest for p_k is the i_k-th row. In the MP decoding based on serial scheduling, processing of the following Expressions 16 to 18 is performed on the i_k-th row, and λ(p_k,j) and V(p_k) are updated.

$$\tau(k) \leftarrow V(p\_k) - \lambda(p\_k, i\_k). \ (k=0,1,\ldots,e-1) \quad \text{[Expression 16]}$$

$$(\lambda(p\_0, i\_0), \ldots, \lambda(p\_(e-1), i\_(e-1))) \leftarrow F(\tau(0), \tau(1), \ldots, \tau(e-1)). \quad \text{[Expression 17]}$$

$$V(p\_k) \leftarrow \tau(k) + \lambda(p\_k, d\_k). \ (k=0,1,\ldots, e-1). \quad \text{[Expression 18]}$$

Expression 16 and Expression 18 are respectively referred to as column processing 1 and column processing 2. F in Expression 17 is a function representing row processing, and sum-product algorithm, normalized min-sum algorithm and the like are known. In the serial scheduling, a series of update operations are sequentially performed on the rows of the parity check matrix, and processing of performing such operations on all rows is one iteration. The decision (hard decision) of 0 or 1 of each bit can be made based on the plus and minus of V(p_k). Because the LDPC code has a small order of rows and columns even with a long code length, the degree of complexity of processing of Expressions 16 to 18 is low.

Figure 5:
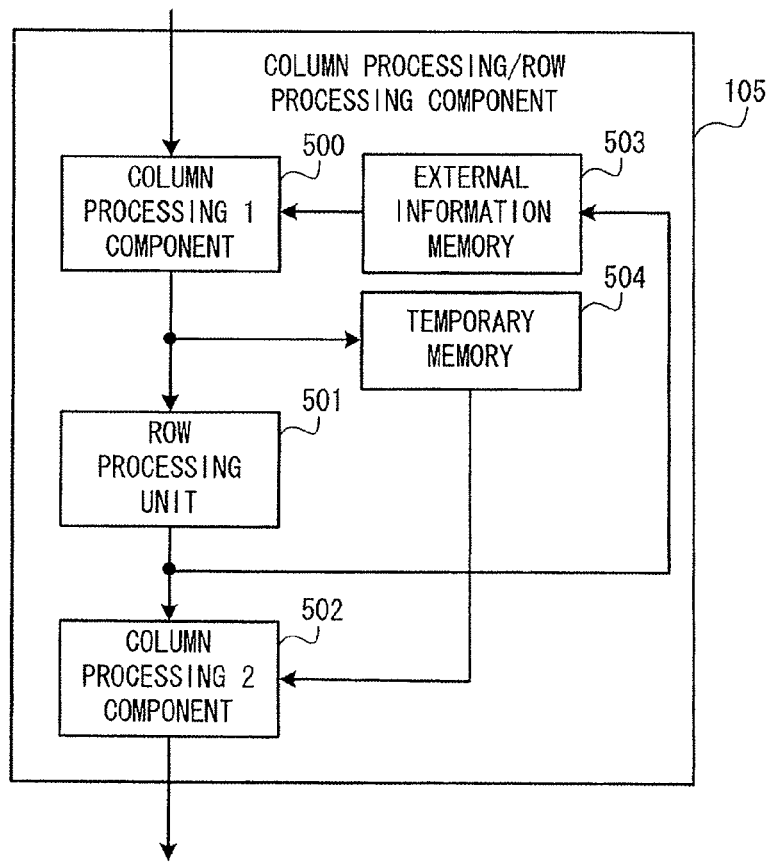
FIG. 5 is a block diagram showing an example of an internal configuration of a column processing/row processing component of the decoding device shown in FIG. 1.

FIG. 5 is a block diagram showing an example of an internal configuration of the column processing/row processing component 105 of the decoding device shown in FIG. 1, which shows a configuration of the column processing/row processing component that executes the above-described Expressions 16 to 18. The column processing/row processing component 105 at least includes a column processing 1 component 500, a row processing unit 501, a column processing 2 component 502, an external information memory 503, and a temporary memory 504.

In the case of performing processing on a row-by-row basis, the column processing 1 component 500 and the column processing 2 component 502 are composed of the row-order-number of processors that perform Expressions 16 and 18. The temporary memory 504 stores τ(k) of Expression 16 and enables calculation of Expression 18.

Figure 6:
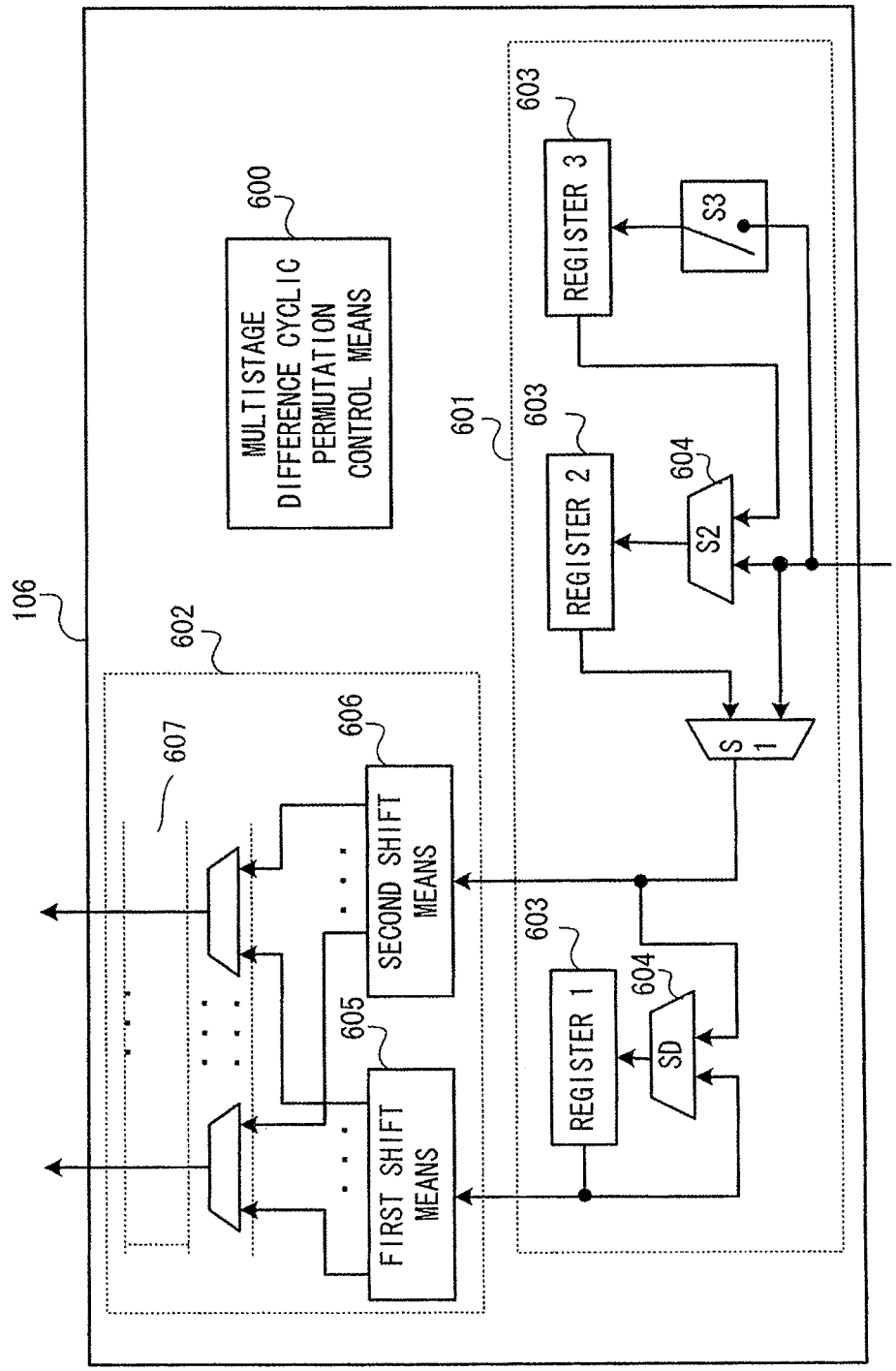
FIG. 6 is a block diagram showing an example of an internal configuration of a multistage difference cyclic permutation means of the decoding device shown in FIG. 1.

FIG. 6 is a block diagram showing an example of an internal configuration of the multistage difference cyclic permutation means 106 of the decoding device shown in FIG. 1. The multistage difference cyclic permutation means 106 at least includes a multistage difference cyclic permutation control means 600, a register update means 601, and a data extraction means 602. The register update means 601 is composed of a plurality of registers 603 and switching means 604 that control update of the registers. The data extraction means 602 is composed of a first shift means 605, a second shift means 606, and a selection means 607.

The register update means 601 basically has a FIFO (First-In First-Out) structure that stores data in units of records output from the column processing/row processing component 105, and further has a structure to implement a function that stores the head record and inserts it as input after the final record, and a function that makes shift for two time points at a time.

The data extraction means 602 performs processing of extracting S number of data from two adjacent records. The data extraction means 602 is composed of the first shift means 605 and the second shift means 606 (which are not cyclic) of each record, and the selection means 607 for selecting either data in each position. The operation of the selection means 607 is decided from shift values of the first shift means 605 and the second shift means 606, and the shift values can be decided using the number of data E of the final record and Flag', Gap' and Offset' of the above-described Expressions 6 to 8 in the multistage difference cyclic permutation control means 600.

The multistage difference cyclic permutation control means 600 performs control of the register update means 601, and setting of the shift values of the first shift means 605 and the second shift means 606, and the selection means 607 in the data extraction means 602.

Note that the multistage cyclic permutation means 303 of the received value arrangement means 103 shown in FIG. 3 can be also achieved in the same configuration as that in FIG. 6, using Flag, Gap and Offset of the above-described Expressions 3 to 5. Further, the multistage cyclic permutation means 402 of the output arrangement means 109 shown in FIG. 4 can be also achieved in the same configuration as that in FIG. 6, using Flag", Gap" and Offset" of Expressions 12 to 14. However, because it is a decoding result, the data width is one bit.

Figure 7A:
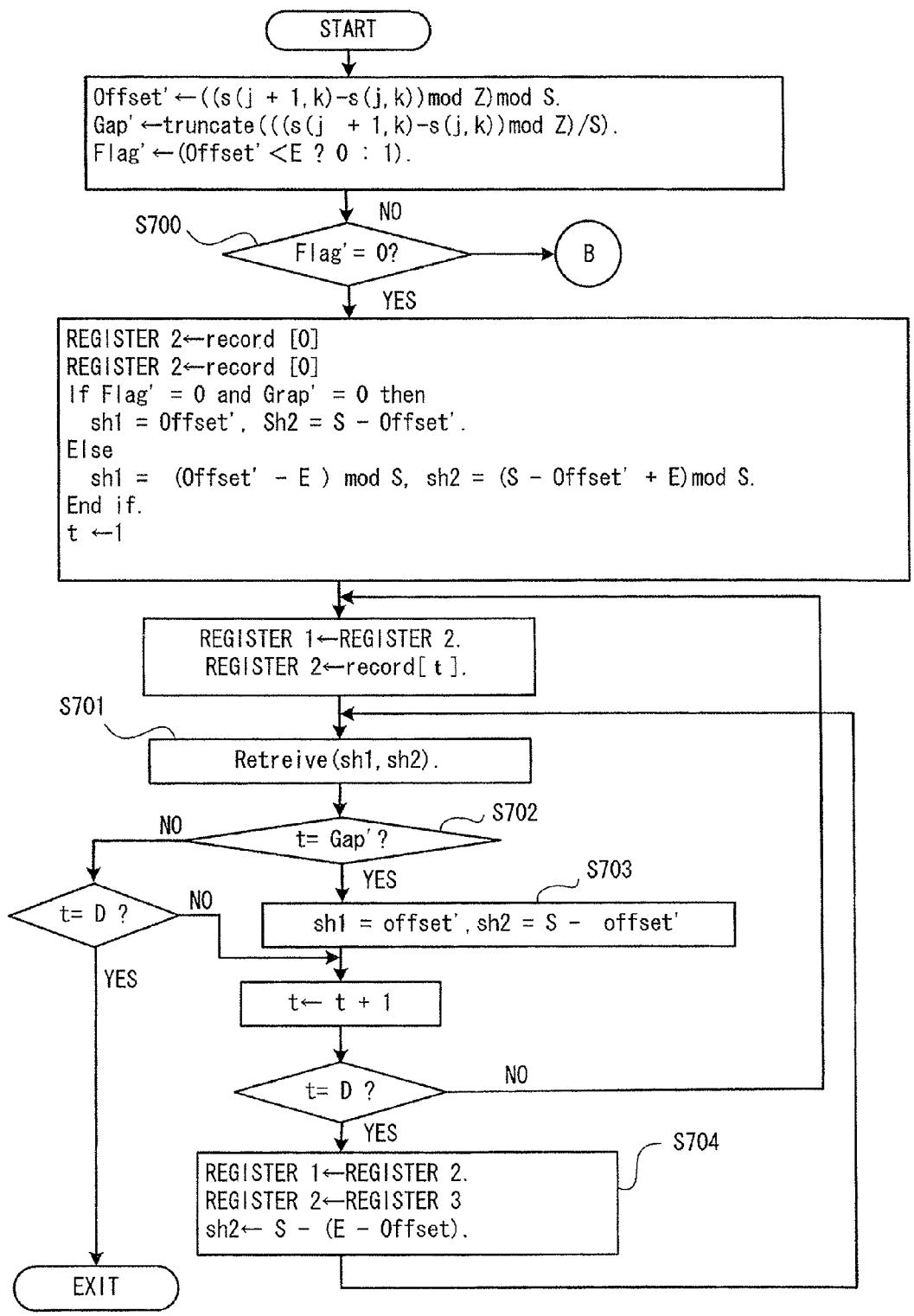
FIG. 7A is a flowchart illustrating an example of an operation of the multistage difference cyclic permutation means shown in FIG. 6 (flowchart 1)
Figure 7B:
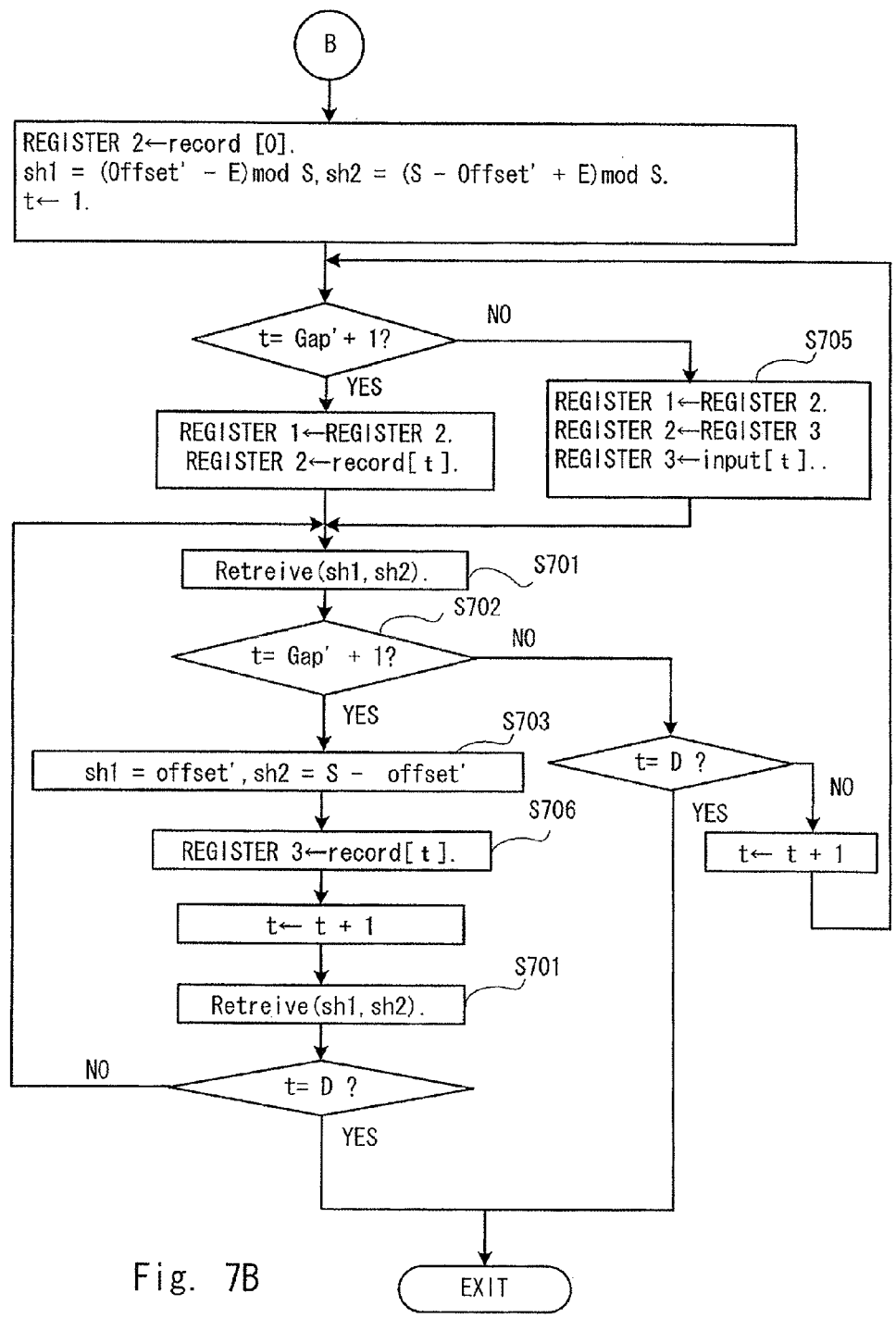
FIG. 7B is a flowchart illustrating an example of an operation of the multistage difference cyclic permutation means shown in FIG. 6 (flowchart 2)
Figure 9:
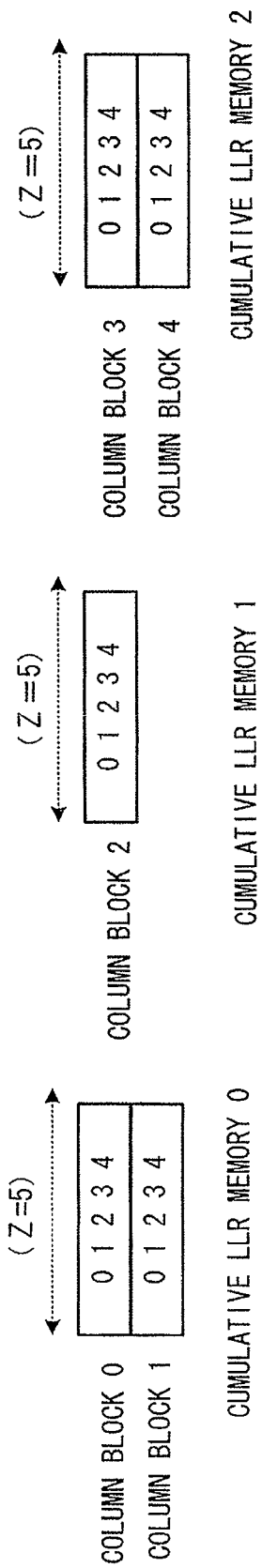
FIG. 9 is a schematic diagram showing a cumulative LLR memory structure and a data storing method for the parity check matrix of FIG. 8.
Figure 10:
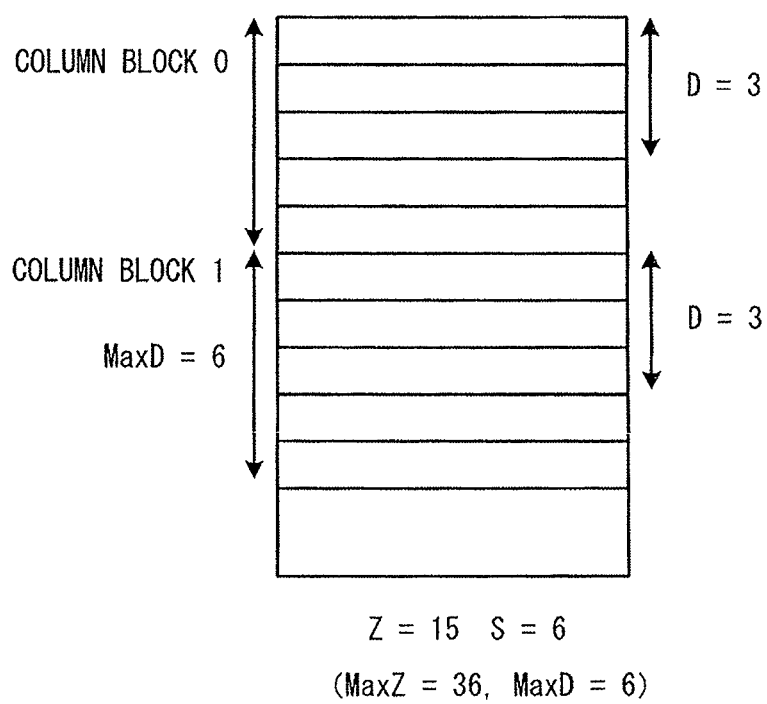
FIG. 10 is a schematic diagram of a data storing method of a cumulative LLR memory in Patent Literature 1.

FIGS. 7A and 7B are flowcharts illustrating an example of the operation of the multistage difference cyclic permutation means 106 shown in FIG. 6. The main steps of FIGS. 7A and 7B are described hereinbelow.

(Step S700) The multistage difference cyclic permutation means 106 makes different control depending on the value of Flag' of Expression 7.

(Step S701) For "Retrieve(sh1, sh2)", in the data extraction means 602, the first shift means 605 makes left shift of the shift value sh1, the second shift means 606 makes right shift of the shift value sh2, and the selection means 607 selects data from the first shift means 605 for sh2 number of values from the left and selects data from the second shift means 606 for (S−sh2) number of values from the right, generates and outputs S number of records.

(Step S702) The values of sh1 and sh2 in "Retrieve( )" are modified based on a comparison result of the time t from the start of processing the block I(j,k) with Gap' or (Gap'+1).

(Step S703) Specific modified values of sh1 and sh2 in Step S702 are shown.

(Step S704) In the case of "Flag'=0", the head record is stored and cyclically added to the final record, thereby generating an output.

(Step S705) In the case of "Flag'=1", among a plurality of registers 603 of the register update means 601, the register 1 and the register 2 are left as they are, and data is read to the register 3 in Step S706. After that, the values of the registers 1, 2 and 3 are updated as shown in Step S705.

Note that, although the flowcharts of FIGS. 7A and 7B are described in the form of software flow, because parallel operation is possible in the loop, the operation in the multistage difference cyclic permutation means 106 can be executed with the number of cycles of about (D+2).

Next, a specific example of the decoding device according to the invention is described regarding the cyclic permutation in the MP decoding for the column block k, taking a case where the order of the column block k in the parity check matrix of the pseudo-cyclic LDPC code is 3, s(0,k)=5, s(1,k)=11, s(2,k)=3, the cyclic permutation size Z=15, and the degree of parallelism S=6 as an example. In such an example of numerical values, D=roundup(15/6)=3, E=15 mod 6=3.

[Writing of Received Value to Cumulative LLR Memory 101]

It is assumed that received value data for the column block k is read into the decoding device at indexes 0, 1, . . . , 14 (=Z−1) in the column block. At this time, the record generation means 302 in the received value arrangement means 103 generates records each containing S number of data as follows, corresponding to the number of data E=3 in the final record, and sequentially transmits the records to the multistage cyclic permutation means 303.

(0): 0 1 2 3 4 5
(1): 6 7 8 9 10 11
(2): 12 13 14 0 1 2

Offset=5, Gap=0, and Flag=1 of Expressions 3 to 5 are set, corresponding to s(0,k)=5, to the multistage cyclic permutation means 303. The multistage cyclic permutation means 303 uses the parameters, rearranges the data as follows using the same configuration as in FIG. 6, and outputs the data.

(0): 2 3 4 5 6 7
(1): 5 6 7 8 9 10
(2): 11 12 13 14 0 1

Further, the address update means 202 in the address administration means 104 generates addresses so that the data is written to the cumulative LLR memory 101 sequentially from the address 0.

address 0: 2 3 4 5 6 7
address 1: 5 6 7 8 9 10
address 2: 11 12 13 14 0 1

The control means 110 calculates init_address=(0+1)mod 3=1 from Gap=0 and Flag=1 by Expression 9 for the column block k, and sets the calculated value as the initial value of read_address for the column block in the address administration means 104.

[Decoding Corresponding to I(0,k)(s(0,k)=5) in First Iteration]

Data is sequentially read from read_address=1, and processing performed in the following sequence in the column processing/row processing component 105.
- (0): 5 6 7 8 9 10
- (1): 11 12 13 14 0 1
- (2): 2 3 4 5 6 7

The data output of the column processing/row processing component 105 is performed in this sequence. The multistage difference cyclic permutation means 106 performs cyclic permutation based on the shift of a difference value (s(1,k)−s(0,k))mod Z=6. The parameters of Expressions 6 to 8 are Offset'=0, Gap'=1, and Flag'=0. Based on the parameters, the multistage difference cyclic permutation means 106 makes the following output.
- (0): 8 9 10 11 12 13
- (1): 11 12 13 14 0 1
- (2): 2 3 4 5 6 7

The address administration means 104 writes the values to the addresses in the same sequence as the sequence during reading.
- address1: 8 9 10 11 12 13
- address2: 11 12 13 14 0 1
- address0: 2 3 4 5 6 7

In this manner, by performing writing to the addresses in the same sequence as the sequence during reading, there is no need to have multiple cumulative LLR memories 101, and update by overwrite is possible.

Note that, in Expression 10, next_address=(Gap'+Flag'+read_address)mod D=(1+0+1)mod 3=2, and this is set as the next read_address by the address administration means 104.

[Decoding Corresponding to I(1,k)(s(1,k)=11) in First Iteration]

Data is sequentially read from read_address=2, and processing performed in the following sequence in the column processing/row processing component 105.
- (0): 11 12 13 14 0 1
- (1): 2 3 4 5 6 7
- (2): 8 9 10 11 12 13

Data output of the column processing/row processing component 105 is also performed in this sequence. The multistage difference cyclic permutation means 106 performs cyclic permutation based on the shift value of a difference value (s(2,k)−s(1,k))mod Z=7. The parameters of Expressions 6 to 8 are Offset'=1, Gap'=1 and Flag'=0. Based on the parameters, the multistage difference cyclic permutation means 106 makes the following output.
- (0): 0 1 2 3 4 5
- (1): 3 4 5 6 7 8
- (2): 9 10 11 12 13 14

The address administration means 104 writes the values to the addresses in the same sequence as the sequence during reading.
- address2: 0 1 2 3 4 5
- address0: 3 4 5 6 7 8
- address1: 9 10 11 12 13 14

Note that, in Expression 10, next_address=(Gap'+Flag'+read_address)mod D=(1+0+2)mod 3=0, and it is set as the next read_address.

[Decoding Corresponding to I(2,k)(s(2,k)=3) in First Iteration]

Data is sequentially read from read_address=0, and processing performed in the following sequence in the column processing/row processing component 105.
- (0): 3 4 5 6 7 8
- (1): 9 10 11 12 13 14
- (2): 0 1 2 3 4 5

Data output of the column processing/row processing component 105 is also performed in this sequence. The multistage difference cyclic permutation means 106 performs cyclic permutation based on the shift value of a difference value (s(0,k)−s(2,k))mod Z=2. The parameters of Expressions 6 to 8 are Offset'=2, Gap'=0 and Flag'=0. Based on the parameters, the multistage difference cyclic permutation means 106 makes the following output.
- (0): 5 6 7 8 9 10
- (1): 11 12 13 14 0 1
- (2): 2 3 4 5 6 7

Assuming that the hard decision is made after the end of the message update processing of I(2,k) in the column block k, the decoding results are sequentially written to the decoding result memory 108 in this record structure. Because overwrite causes no problem in the decoding result memory 108, there is no problem when writing is carried out always from address0, which is different from the cumulative LLR memory 101. For the cumulative LLR memory 101, the address administration means 104 writes the values to the addresses in the same sequence as the sequence during reading.
- address0: 5 6 7 8 9 10
- address1: 11 12 13 14 0 1
- address2: 2 3 4 5 6 7

Note that, in Expression 10, next_address=(Gap'+Flag'+read_address)mod D=(0+0+0)mod 3=0, and it is set as the next read_address in the address administration means.

[Decoding Corresponding to I(0,k) (s(0,k)=5) in Second Iteration]

Be aware that read_address=0, differently from the message update processing corresponding to I(0,k) in the first iteration. In this invention, dynamic enabling of read_address is possible using the control means 110 and the address administration means 104.

After that, the message update processing is executed in the same manner as in the first iteration.

[Output of Decoding Result]

In the decoding result memory 108, the decoding result bits are stored in the sequencer of
- address0: 5 6 7 8 9 10
- address1: 11 12 13 14 0 1
- address2: 2 3 4 5 6 7 corresponding to after the message update processing corresponding to I(2,k).

During generation of output, the values are read from the decoding result memory 108 in this sequence, and, based on (−s(0,k)mod Z)=10, the parameters of Expressions 11 to 13 are Offset''=4, Gap''=1, and Flag''=1, and the multistage cyclic permutation means 402 of the output arrangement means 109 arranges the decoding results as follows and stores temporarily.
- (0): 6 7 8 9 10 11
- (1): 12 13 14 0 1 2
- (2): 0 1 2 3 4 5

The output sequence forming means 403 performs reading from output_address=(Gap''+Flag'')=2 in Expression 14 as the starting point, removes padding, and outputs the decoding results in the original sequence 0, 1, 2, . . . , 13, 14.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

For example, an exemplary aspect of the invention may be represented as the following configuration, in addition to the configurations (1) and (8) described in Solution to Problem. The following numerals (2) to (7) and (9) to (10) respectively correspond to Claim numbers.

(2) The decoding device according to the above (1), in which
the address administration means includes
a current address register for storing an address serving as a reading start point of the cumulative LLR memories; and
an address update means for controlling a reading address and a writing address of the cumulative LLR memories, using the address of the current address register as an initial value, and
the current address register performs update to store the reading start address in subsequent processing of same memory area calculated by the control means.

(3) The decoding device according to the above (1) or (2), in which
the received value arrangement means at least includes
a record generation means for arranging received data by record and outputting the data;
a multistage cyclic permutation means for performing the same processing as the multistage difference cyclic permutation means; and
a received value arrangement control means for managing parameters to be used by the record generation means and the multistage cyclic permutation means.

(4) The decoding device according to the above (3), in which
cyclic permutation at a head of each column block in a parity check matrix of the pseudo-cyclic low-density parity-check codes is identical transformation, and
the received value arrangement means includes the record generation means and the received value arrangement control means.

(5) The decoding device according to any one of the above (1) to (4), at least including:
a decoding result memory for storing results of deciding 0 or 1 of codeword bits from the cumulative reliability information;
an output arrangement means for performing arrangement when outputting decoding results from the decoding result memory in accordance with operation of the multistage difference cyclic permutation means; and
a means for calculating parameters to be used by the output arrangement means.

(6) The decoding device according to the above (5), in which
the output arrangement means at least includes
a multistage cyclic permutation means for performing the same processing as the multistage difference cyclic permutation means on bit-by-bit basis;
an output sequence forming means for generating an output sequence from output of the multistage cyclic permutation means; and
an output arrangement control means for managing parameters to be used by the multistage cyclic permutation means and the output forming means.

(7) The decoding device according to the above (6), in which
cyclic permutation at a head of each column block in a parity check matrix of the pseudo-cyclic low-density parity-check codes is identical transformation, and
the output arrangement means includes the output sequence forming means and the output arrangement control means.

(9) The decoding method according to the above (8), in which
decoding results of deciding 0 or 1 of codeword bits from the cumulative reliability information are arranged and output in accordance with operation of the multistage difference cyclic permutation step.

(10) The decoding method according to the above (8) or (9), in which
cyclic permutation at a head of each column block in a parity check matrix of the pseudo-cyclic low-density parity-check codes is identical transformation.

This application is based upon and claims the benefit of priority from Japanese patent application No. 2009-061184 filed on Mar. 13, 2009 the disclosure of which is incorporated herein in its entirety by reference.

INDUSTRIAL APPLICABILITY

The present invention may be suitably applied to a decoding device and a decoding method of a pseudo-cyclic LDPC code with a variable code length in mobile communication and the like.

REFERENCE SIGNS LIST

100 ROM
101 CUMULATIVE LLR MEMORY
102 MEMORY INPUT CONTROL
103 RECEIVED VALUE ARRANGEMENT MEANS
103A RECORD GENERATION MEANS
104 ADDRESS ADMINISTRATION MEANS
105 COLUMN PROCESSING/ROW PROCESSING COMPONENT
106 MULTISTAGE DIFFERENCE CYCLIC PERMUTATION MEANS
106A MULTISTAGE CYCLIC PERMUTATION MEANS
106B MULTISTAGE CYCLIC PERMUTATION MEANS
107 HARD DECISION MEANS
108 DECODING RESULT MEMORY
109 OUTPUT ARRANGEMENT MEANS
109A OUTPUT SEQUENCE FORMING MEANS
110 CONTROL MEANS
110A CONTROL MEANS
201 CURRENT ADDRESS REGISTER
202 ADDRESS UPDATE MEANS
301 RECEIVED VALUE ARRANGEMENT CONTROL MEANS
302 RECORD GENERATION MEANS
303 MULTISTAGE CYCLIC PERMUTATION MEANS
401 OUTPUT ARRANGEMENT CONTROL MEANS
402 MULTISTAGE CYCLIC PERMUTATION MEANS
403 OUTPUT SEQUENCE FORMING MEANS
500 COLUMN PROCESSING 1 COMPONENT
501 ROW PROCESSING UNIT
502 COLUMN PROCESSING 2 COMPONENT
503 EXTERNAL INFORMATION MEMORY
504 TEMPORARY MEMORY
600 MULTISTAGE DIFFERENCE CYCLIC PERMUTATION CONTROL MEANS
601 REGISTER UPDATE MEANS
602 DATA EXTRACTION MEANS
603 REGISTER
604 SWITCHING MEANS
605 FIRST SHIFT MEANS
606 SECOND SHIFT MEANS
607 SELECTION MEANS

The invention claimed is:

1. A decoding device for pseudo-cyclic low-density parity-check codes having a structure with a variable cyclic permutation size, at least comprising:
a plurality of cumulative LLR memories for storing cumulative reliability information being received values of the low-density parity-check codes or a sum of reliability information generated in a decoding process and the received values;
a plurality of column processing/row processing components each including a plurality of processors corresponding to column processing and row processing of low-density parity-check code decoding for updating the reliability information;
a multistage difference cyclic permutation means for performing cyclic permutation of data in a multistage fashion with a degree of parallelism corresponding to the number of data in one record of the cumulative LLR memories between the cumulative LLR memories and the column processing/row processing components, and, during writing to the cumulative LLR memories, executing processing integrating permutation for subsequent reading;
a received value arrangement means for performing permutation of received data during writing of the received data to the cumulative LLR memories in accordance with operation of the multistage difference cyclic permutation means;
an address administration means for storing a reading start address of the cumulative LLR memories and incrementing the address at reading in accordance with operation of the multistage difference cyclic permutation means; and
a control means for calculating parameters to be used by the multistage difference cyclic permutation means and the received value arrangement means and the reading start address of the cumulative LLR memories to be stored in the address administration means.

2. The decoding device according to claim 1, wherein the address administration means includes
a current address register for storing an address serving as a reading start point of the cumulative LLR memories; and
an address update means for controlling a reading address and a writing address of the cumulative LLR memories, using the address of the current address register as an initial value, and
the current address register performs update to store the reading start address in subsequent processing of same memory area calculated by the control means.

3. The decoding device according to claim 2, wherein the received value arrangement means at least includes
a record generation means for arranging received data by record and outputting the data;
a multistage cyclic permutation means for performing the same processing as the multistage difference cyclic permutation means; and
a received value arrangement control means for managing parameters to be used by the record generation means and the multistage cyclic permutation means.

4. The decoding device according to claim 3, wherein cyclic permutation at a head of each column block in a parity check matrix of the pseudo-cyclic low-density parity-check codes is identical transformation, and
the received value arrangement means includes the record generation means and the received value arrangement control means.

5. The decoding device according to claim 4, at least comprising:
a decoding result memory for storing results of deciding 0 or 1 of codeword bits from the cumulative reliability information;
an output arrangement means for performing arrangement when outputting decoding results from the decoding result memory in accordance with operation of the multistage difference cyclic permutation means; and
a means for calculating parameters to be used by the output arrangement means.

6. The decoding device according to claim 3, at least comprising:
a decoding result memory for storing results of deciding 0 or 1 of codeword bits from the cumulative reliability information;
an output arrangement means for performing arrangement when outputting decoding results from the decoding result memory in accordance with operation of the multistage difference cyclic permutation means; and
a means for calculating parameters to be used by the output arrangement means.

7. The decoding device according to claim 2, at least comprising:
a decoding result memory for storing results of deciding 0 or 1 of codeword bits from the cumulative reliability information;
an output arrangement means for performing arrangement when outputting decoding results from the decoding result memory in accordance with operation of the multistage difference cyclic permutation means; and
a means for calculating parameters to be used by the output arrangement means.

8. The decoding device according to claim 7, wherein the output arrangement means at least includes
a multistage cyclic permutation means for performing the same processing as the multistage difference cyclic permutation means on bit-by-bit basis;
an output sequence forming means for generating an output sequence from output of the multistage cyclic permutation means; and
an output arrangement control means for managing parameters to be used by the multistage cyclic permutation means and the output forming means.

9. The decoding device according to claim 1, wherein the received value arrangement means at least includes
a record generation means for arranging received data by record and outputting the data;
a multistage cyclic permutation means for performing the same processing as the multistage difference cyclic permutation means; and
a received value arrangement control means for managing parameters to be used by the record generation means and the multistage cyclic permutation means.

10. The decoding device according to claim 9, wherein cyclic permutation at a head of each column block in a parity check matrix of the pseudo-cyclic low-density parity-check codes is identical transformation, and
the received value arrangement means includes the record generation means and the received value arrangement control means.

11. The decoding device according to claim 10, at least comprising:
a decoding result memory for storing results of deciding 0 or 1 of codeword bits from the cumulative reliability information;

an output arrangement means for performing arrangement when outputting decoding results from the decoding result memory in accordance with operation of the multistage difference cyclic permutation means; and a means for calculating parameters to be used by the output arrangement means.

12. The decoding device according to claim 9, at least comprising:

a decoding result memory for storing results of deciding 0 or 1 of codeword bits from the cumulative reliability information;

an output arrangement means for performing arrangement when outputting decoding results from the decoding result memory in accordance with operation of the multistage difference cyclic permutation means; and a means for calculating parameters to be used by the output arrangement means.

13. The decoding device according to claim 12, wherein the output arrangement means at least includes a multistage cyclic permutation means for performing the same processing as the multistage difference cyclic permutation means on bit-by-bit basis;

an output sequence forming means for generating an output sequence from output of the multistage cyclic permutation means; and an output arrangement control means for managing parameters to be used by the multistage cyclic permutation means and the output forming means.

14. The decoding device according to claim 1, at least comprising:

a decoding result memory for storing results of deciding 0 or 1 of codeword bits from the cumulative reliability information;

an output arrangement means for performing arrangement when outputting decoding results from the decoding result memory in accordance with operation of the multistage difference cyclic permutation means; and a means for calculating parameters to be used by the output arrangement means.

15. The decoding device according to claim 14, wherein the output arrangement means at least includes a multistage cyclic permutation means for performing the same processing as the multistage difference cyclic permutation means on bit-by-bit basis;

an output sequence forming means for generating an output sequence from output of the multistage cyclic permutation means; and an output arrangement control means for managing parameters to be used by the multistage cyclic permutation means and the output forming means.

16. The decoding device according to claim 15, wherein cyclic permutation at a head of each column block in a parity check matrix of the pseudo-cyclic low-density parity-check codes is identical transformation, and the output arrangement means includes the output sequence forming means and the output arrangement control means.

17. A decoding method for pseudo-cyclic low-density parity-check codes having a structure with a variable cyclic permutation size, at least comprising:

a storing step for storing cumulative reliability information being received values of the low-density parity-check codes or a sum of reliability information generated in a decoding process and the received values into a memory; and a multistage difference cyclic permutation step for performing cyclic permutation of data in a multistage fashion with a degree of parallelism corresponding to the number of data in one record of the memory during column processing and row processing of low-density parity-check code decoding for updating the reliability information, and, during writing to the memory, executing processing integrating permutation for subsequent reading, wherein, during writing of the received data to the memory, permutation of received data is performed, and, during reading from a reading start address of the memory, the reading start address is incremented and stored again, in accordance with operation of the multistage difference cyclic permutation step.

18. The decoding method according to claim 17, wherein decoding results of deciding 0 or 1 of codeword bits from the cumulative reliability information are arranged and output in accordance with operation of the multistage difference cyclic permutation step.

19. The decoding method according to claim 18, wherein cyclic permutation at a head of each column block in a parity check matrix of the pseudo-cyclic low-density parity-check codes is identical transformation.

20. The decoding method according to claim 17, wherein cyclic permutation at a head of each column block in a parity check matrix of the pseudo-cyclic low-density parity-check codes is identical transformation.

* * * * *